United States Patent
Fujimura et al.

(10) Patent No.: US 10,514,097 B2
(45) Date of Patent: Dec. 24, 2019

(54) METHOD FOR PRODUCING PISTON RING WITH RECESS

(71) Applicant: NIPPON PISTON RING CO., LTD., Saitama-shi, Saitama (JP)

(72) Inventors: Kazuhiro Fujimura, Saitama (JP); Atsushi Chiba, Saitama (JP); Naoyuki Akimoto, Saitama (JP); Iwao Hiraishi, Saitama (JP)

(73) Assignee: NIPPON PISTON RING CO., LTD., Saitama-shi, Saitama (JP)

( * ) Notice: Subject to any disclaimer, the term of this patent is extended or adjusted under 35 U.S.C. 154(b) by 132 days.

(21) Appl. No.: 15/672,942

(22) Filed: Aug. 9, 2017

(65) Prior Publication Data
US 2017/0335965 A1    Nov. 23, 2017

Related U.S. Application Data

(63) Continuation of application No. 13/503,381, filed as application No. PCT/JP2009/070117 on Nov. 30, 2009, now abandoned.

(51) Int. Cl.
*F16J 9/26*   (2006.01)
*C23C 14/06*  (2006.01)
(Continued)

(52) U.S. Cl.
CPC .............. *F16J 9/26* (2013.01); *B23P 15/06* (2013.01); *B23P 15/065* (2013.01);
(Continued)

(58) Field of Classification Search
CPC .. F16J 9/26; F16J 9/20; C23C 14/0641; B23P 15/06; B23P 15/065
See application file for complete search history.

(56) References Cited

U.S. PATENT DOCUMENTS

| 2,511,874 A | 6/1950 | Phillips |
| 3,947,046 A * | 3/1976 | Maruyama ............... F16J 9/20 |
| | | 277/443 |

(Continued)

FOREIGN PATENT DOCUMENTS

| CN | 101205849 A | 6/2008 |
| GB | 1133753 A | 11/1968 |

(Continued)

OTHER PUBLICATIONS

Extended European search report, dated Feb. 19, 2015, in corresponding European Patent Application No. 09851678.4 (Cited in the IDS filed in U.S. Appl. No. 13/503,381).

(Continued)

*Primary Examiner* — Christopher J Besler
*Assistant Examiner* — Christine Pellazar Bersabal
(74) *Attorney, Agent, or Firm* — Muncy, Geissler, Olds & Lowe, P.C.

(57) ABSTRACT

A method for producing a piston ring for a cylinder that moves in a sliding direction includes providing a piston ring base material having an upper surface, a lower surface and an outer circumferential surface having a first recess between the upper surface and the lower surface, forming a hard film in the first recess and on a cylindrical surface at a predetermined thickness, and removing, by performing a polishing process on the sliding surface, the hard film formed on the cylindrical surface and a part of the piston ring base material disposed adjacent to the removed hard film, to form a second recess. The second recess is formed by removing an area of the removed part of the piston ring base material as a result of polishing the sliding surface due to a difference in the hardness of the hard film and the piston ring base material.

18 Claims, 6 Drawing Sheets

(51) Int. Cl.
  *F16J 9/20*   (2006.01)
  *B23P 15/06*  (2006.01)
(52) U.S. Cl.
  CPC .............. *C23C 14/0641* (2013.01); *F16J 9/20* (2013.01); *F16J 9/206* (2013.01)

(56) References Cited

U.S. PATENT DOCUMENTS

| | | | |
|---|---|---|---|
| 4,323,257 A | | 4/1982 | Kondo et al. |
| 5,206,379 A | | 4/1993 | Motoki et al. |
| 6,206,379 B1 | * | 3/2001 | Toshiaki ............... F16J 9/203 277/436 |
| 7,354,045 B2 | | 4/2008 | Abe et al. |
| 7,871,078 B2 | * | 1/2011 | Fischer ................. F16J 9/26 277/442 |
| 2002/0190476 A1 | * | 12/2002 | Preyer ................. F16J 9/206 277/444 |
| 2007/0128807 A1 | | 6/2007 | Fischer et al. |
| 2009/0174150 A1 | | 7/2009 | Smith et al. |
| 2010/0044967 A1 | | 2/2010 | Esser et al. |

FOREIGN PATENT DOCUMENTS

| | | |
|---|---|---|
| JP | 55-69742 A | 5/1980 |
| JP | 51146657 A | 7/1986 |
| JP | 7-30347 U | 6/1995 |
| JP | 2005-114096 A | 4/2005 |
| JP | 2005-273583 A | 10/2005 |
| JP | 2007-520666 A | 7/2007 |

OTHER PUBLICATIONS

International Search Report, PCT/JP2009/070117, dated Dec. 28, 2009 (Cited in the IDS filed in U.S. Appl. No. 13/503,381).

* cited by examiner

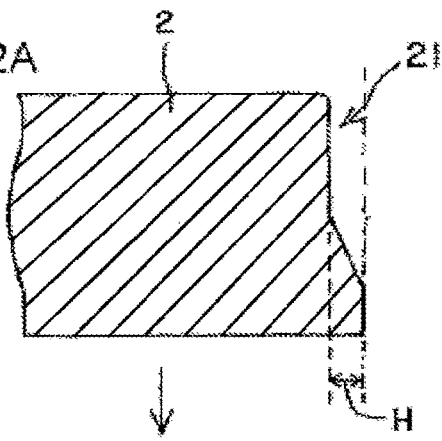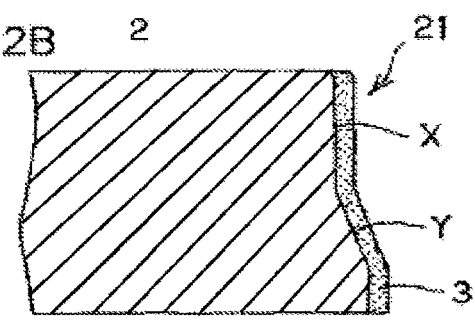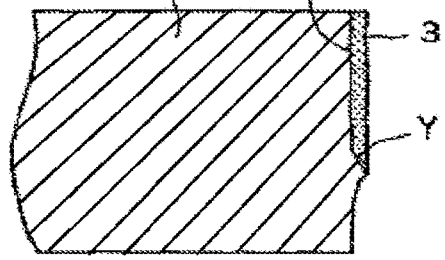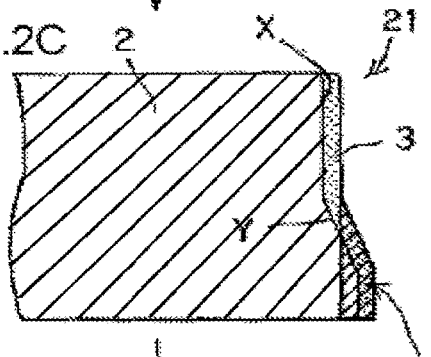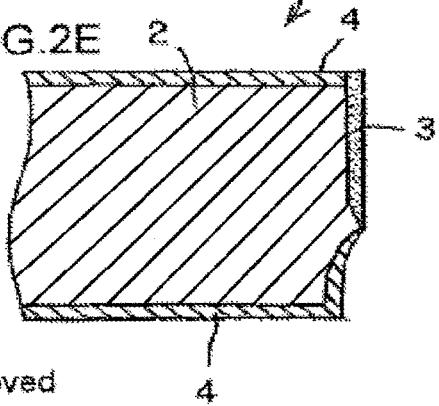

METHOD FOR PRODUCING PISTON RING WITH RECESS

CROSS REFERENCE TO RELATED APPLICATIONS

The present application is a continuation of U.S. patent application Ser. No. 13/503,381, filed on Apr. 23, 2012.

TECHNICAL FIELD

The present invention relates to a piston ring used in an internal combustion engine.

BACKGROUND ART

Generally, a pressure ring and an oil ring are attached to a piston for an internal combustion engine as piston rings. The pressure ring is provided with a function of preventing a phenomenon (blow-by) in which high pressure combustion gas flows from a combustion chamber toward a crankcase. On the other hand, the oil ring is mainly provided with a function of suppressing a phenomenon (oil loss via the piston ring) in which redundant lubricant on a cylinder inner wall enters a combustion chamber from a crankcase and is consumed. As a combination of conventionally standard piston rings, there is known a combination of three piston rings, i.e., one oil ring and two compression rings including a top ring and a second ring.

In recent years, with reduction tendency in weight and increase tendency in output of the internal combustion engine, quality required for the piston ring is increasing.

One performance required for the piston ring for the internal combustion engine is wear resistance. As a means that enhances the wear resistance, at present, a nitride layer is formed by a nitriding treatment or a hard film is formed by a PVD method on a sliding surface of an outer periphery of the piston ring.

The piston ring for the internal combustion engine is also required to have oil scraping performance for suppressing the oil loss via the piston ring. As a means that enhances the oil scraping performance, it is necessary to form an edge portion mainly on the side of a lower surface of the piston ring into a sharp shape.

When the two requirements are to be satisfied at the same time, however, the hard film is formed on the sliding surface of the outer periphery of the piston ring and the edge portion of the hard film is formed into the sharp shape. According to this, since the hard film formed on the sliding surface is "hard", the film easily becomes chipped and therefore, especially the edge portion easily becomes chipped.

To solve such a problem, patent document 1 discloses a technique in which the hard film is partially formed instead of covering the entire sliding surface of the piston ring with the hard film, a sharply shaped piston ring base material is exposed in the edge portion which satisfies the oil scraping performance.

PRIOR ART DOCUMENTS

Patent Document

Patent Document 1: Japanese Patent Application National Publication (Laid-Open) No. 2007-520666

SUMMARY OF THE INVENTION

Problems to be Solved by the Invention

According to the piston ring of patent document 1, it is surely possible to satisfy, at the same time, the above two performances (wear resistance and oil scraping performance) required for the piston ring.

In the piston ring of patent document 1, however, since the piston ring base material and the hard film which is harder than the base material exist on the same sliding surface, sliding surfaces having different hardness come into contact with an inner peripheral surface of the cylinder at the same time. According to this, due to the difference in sliding properties, a vertical scratch or a scuff is generated on the relatively soft piston ring base material, this may generate a scratch on the inner peripheral surface of the cylinder, may roughly wear away the inner peripheral surface, or may abnormally wear away the piston ring itself.

The invention of the present application has been accomplished in view of such a problem, and it is a main object of the present invention to provide a piston ring which can satisfy wear resistance, gas sealing performance and oil scraping performance at the same time, which does not generate a scratch or a scuff on a sliding surface of the piston ring, which does not damage or wear an inner peripheral surface of a cylinder as a mating member of the sliding surface, and which does not abnormally wear.

Means for Solving the Problems

In order to solve the above problems, the present invention relates to a piston ring provided at its outer periphery with a sliding surface, Wherein in a cross section thereof which is perpendicular to a radial direction of the piston ring, the sliding surface includes a first sliding surface which occupies a predetermined region from one end thereof, and a second sliding surface which occupies a region extending from one end to the other end of the first sliding surface, the first sliding surface is formed of hard film, the second sliding surface is not formed of hard film, and the second sliding surface exists at a position deviated inward from a phantom line extending from the first sliding surface toward the other end.

It is also preferable in the present invention that the first sliding surface is formed by forming a recess in a base material of the piston ring, and by providing the recess with a hard film, in the cross section of the piston ring which is perpendicular to the radial direction of the piston ring, the recess includes a first surface extending from one of upper and lower surfaces of the base material toward the other one of the upper and lower surfaces in parallel to an outer peripheral surface of the piston ring, and a second surface extending from one end of the first surface toward the outer peripheral surface of the piston ring, and the second surface forming the recess and the outer peripheral surface of the piston ring are in contact with each other at an angle of 10° to 30°.

It is also preferable in the present invention that the hard film forming the first sliding surface is a Cr—N type film or a Cr—B—N type film formed by a PVD method.

It may be also possible in the present invention that the second sliding surface is formed of base material of the piston ring.

Further, it may be possible in the present invention that the outer periphery has a barrel face shape or an eccentric barrel face shape.

Effect of the Invention

According to the present invention, in the piston ring provided at its outer periphery with the sliding surface, the sliding surface includes the first sliding surface which is formed of hard film and the second sliding surface which is not formed of hard film. Therefore, the first sliding surface can give "wear resistance" to the piston ring, and the second sliding surface can secure "gas sealing performance and oil scraping performance". Further, since the second sliding surface exists at the position deviated inward from the phantom line extending from the first sliding surface toward the other end. Hence, it is possible to prevent the two sliding surfaces having different hardness from coming into contact with an inner peripheral surface of the cylinder at the same time. Therefore, it is possible to prevent a scratch or a scuff from being generated on the second sliding surface having lower hardness than that of the first sliding surface. This configuration prevents the inner peripheral surface of the cylinder which is a mating member from being damaged or worn, and prevents the piston ring itself from being abnormally worn.

The outer peripheral surface of the base material of the piston ring which is the recess on which the hard film is formed is formed into the predetermined shape. According to this, a boundary portion between the base material and the hard film becomes a "gentle" inclined surface (10° to 30°). As a result, it is possible to prevent stress from concentrating on one point of the hard film, and to prevent the hard film itself from peeling off from the base material.

Further, since the second sliding surface exists at the deviated position, it can be expected that the deviated portion functions as appropriate oil collects, and according to this, it is possible to expect that the wear amount of the entire sliding surface of the piston ring is reduced.

If a proportion of the second sliding surface in the entire sliding surface and the deviation amount are taken into consideration, a demerit that blow-by is increased can not be generated.

In the invention of the present application, the hard film forming the first sliding surface is a Cr—N type film or a Cr—B—N type film formed by a PVD method. According to this, it is possible to sufficiently satisfy the wear resistance which is required for the piston ring, to enhance adhesion with respect to base material, and to prevent the peel off.

In the invention of the present application, the second sliding surface is formed of base material of the piston ring. According to this, it becomes easy to form the end of the second sliding surface into a sharp shape, and a yield can be enhanced.

The invention of the present application can also be applied to a piston ring having a barrel face shaped outer peripheral surface.

BRIEF DESCRIPTION OF THE DRAWINGS

FIGS. 2A to 2E are step diagrams showing one example of a producing method;

BEST MODES FOR CARRYING OUT THE INVENTION

A piston ring of the present invention will be described concretely using the drawings.

Figure 1A:
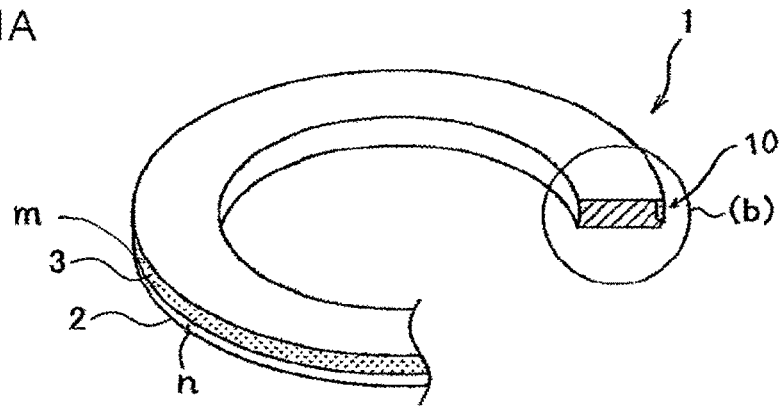
FIG. 1A is a perspective view of a piston ring of the present invention which is partially shown in section taken along a direction perpendicular to a radial direction of the piston ring.
Figure 1B:
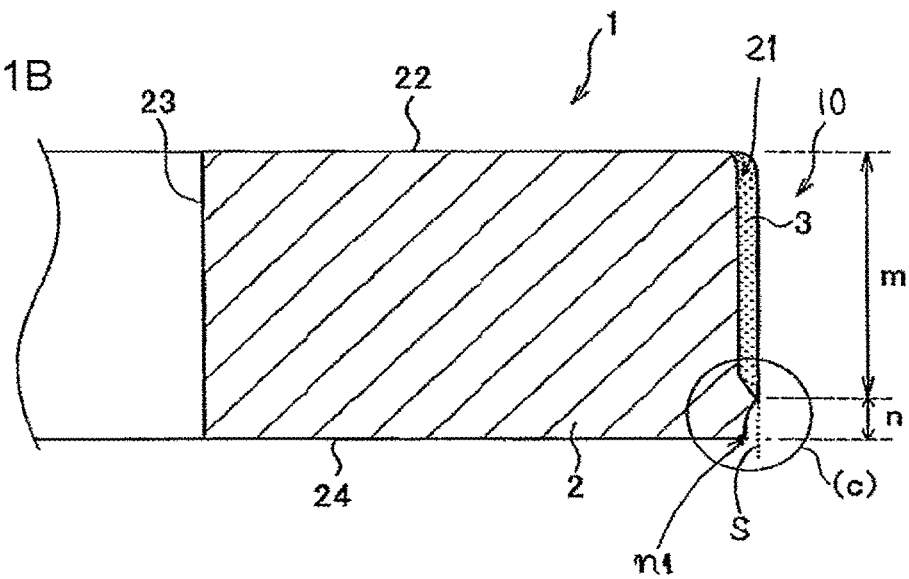
FIG. 1B is an enlarged sectional view of FIG. 1A.
Figure 1C:
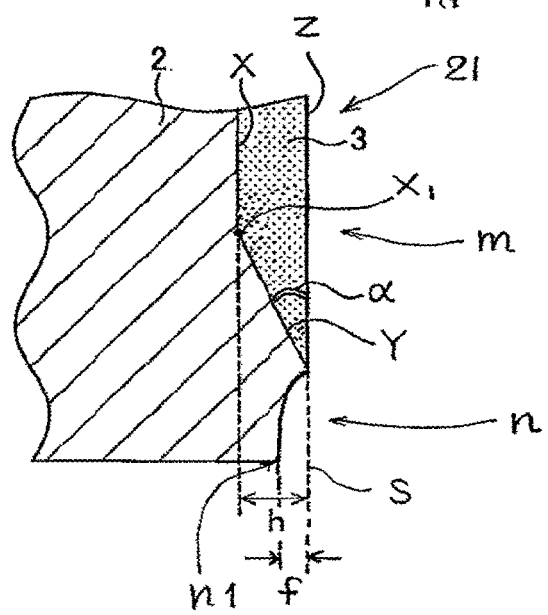
FIG. 1C is a further enlarged view of FIG. 1B.

FIG. 1A is a perspective view of a piston ring of the present invention which is partially shown in section taken along a direction perpendicular to a radial direction of the piston ring, FIG. 1B is an enlarged sectional view of FIG. 1A, and FIG. 1C is a further enlarged view of FIG. 1B. The piston ring of the present invention is provided with a gap portion, which is not shown in FIGS. 1A to 1C.

As shown in FIGS. 1A to 1C, the piston ring 1 of the present invention is provided at its outer periphery with a sliding surface 10.

As shown in FIGS. 1B and 1C, when a cross section of the piston ring is viewed from a direction perpendicular to a radial direction of the piston ring, the sliding surface 10 includes a first sliding surface m which occupies a predetermined region extending from one end of the piston ring (upper end in FIGS. 1A to 1C) and a second sliding surface n which occupies a region extending from an end of the first sliding surface m to the other end (lower end in FIGS. 1A to 1C). The first sliding surface m is formed of hard film 3, but the hard film 3 does not exist on the second sliding surface n. In an embodiment shown in FIGS. 1A to 1C, a piston ring base material 2 is exposed as it is. The second sliding surface n is characterized in that it exists at a position deviated inward (toward an inner peripheral surface of the piston ring shown in FIG. 1C) from a phantom line S extending from the first sliding surface m toward the other end (lower end in FIGS. 1A to 1C).

According to such a piston ring 1 of the present invention, since the sliding surface 10 includes the first sliding surface m which formed of hard film 3 and the second sliding surface n which is not formed of hard film (piston ring base material 2 is exposed). Therefore, the first sliding surface m can give "wear resistance" to the piston ring 1, and the second sliding surface n can secure "gas seal performance and oil scraping performance". Further, since the second sliding surface n exists at the position deviated from the phantom line S which is obtained by extending the first sliding surface m toward the lower end, it is possible to prevent the two sliding surfaces (m and n) having different hardness from coming into contact with the cylinder inner peripheral surface at the same time. Hence, it is possible to avoid a case where a scratch or a scuff is generated on the second sliding surface n having hardness lower than that of the first sliding surface m. According to this, the cylinder inner peripheral surface which is a mating member is not damaged or worn, and the piston ring itself is not abnormally worn.

The base material 2 which configures the piston ring 1 of the present invention will be described below.

Material of the base material 2 is not especially limited and any material can be used. For example, steel can be used mainly as the material. As stainless steel, it is possible to use SUS440, SUS410, SUS304 or the like expressed in JIS, or 8Cr steel, 10Cr steel, SWOSC-V, SWRH material or the like.

Next, the first sliding surface m will be described.

The first sliding surface m is characterized in that it occupies the predetermined region of the sliding surface of the piston ring 1 extending from its one end (upper end in FIGS. 1A to 1C), and the first sliding surface m is formed of hard film 3.

Here, the first sliding surface m can be formed by providing a recess 21 in a portion of the piston ring base material 2 which will become the first sliding surface, and by providing the hard film 3 on the recess 21.

The shape of the recess 21 is not especially limited, but it is preferable that a depth h (=thickness of the hard film 3) of the recess 21 gradually becomes shallower (thinner) at the end of the first sliding surface m as shown in FIG. 1C. More specifically, as shown in FIG. 1C, when a cross section of the piston ring which is perpendicular to a radial direction thereof is viewed, it is preferable that the recess 21 is formed in the base material 2 such that the recess 21 includes a first surface X extending from an upper surface to a lower surface (or from the lower surface to the upper surface) of the base material in parallel to a piston ring outer peripheral surface Z and a second surface Y extending from one end $X_1$ of the first surface X toward the piston ring outer peripheral surface Z, and the second surface Y and the piston ring outer peripheral surface Z (surface of the hard film 3 formed on the recess 21) come into contact with each other at an angle of 10° to 30° (see a in FIG. 1C). According to this shape, it is possible to prevent the hard film 3 from being peeled from the piston ring base material 2.

The depth h (=thickness of the hard film 3) of the recess 21 is not especially limited in the invention of the present application, but if performance of the hard film 3 which is provided on the recess 21 and functions as the first sliding surface m and a producing cost are taken into consideration, the depth is preferably about 1 to 70 μm, and more preferably 10 to 60 μm. If the depth is less than 1 μm, there is a problem that the film wears out and durability is deteriorated, and if the depth exceeds 70 μm, producing time is increased and this is not preferable in terms of cost. As described above, the depth h of the recess 21 eventually becomes equal to the thickness of the hard film 3 formed on that portion.

A proportion of the first sliding surface m in the entire piston ring sliding surface 10 (i.e., an axial length of the recess 21 provided in the piston ring base material 2) is not especially limited in the invention of the present application. However, to provide the piston ring 1 with wear resistance, it is necessary to sufficiently form the hard film 3 on the sliding surface 10, and a role of the second sliding surface n (details thereof will be described later) which is formed independently from the first sliding surface is to sharpen the edge and to enhance the gas sealing performance and the oil scraping performance. Hence, it is preferable that the proportion of the first sliding surface m (length of the recess 21) is about 75 to 95% of the entire length of the cross section of the piston ring. Therefore, the proportion of the second sliding surface n in the entire sliding surface is 5 to 25% of the entire length. If the proportion of the second sliding surface n in the entire sliding surface is less than 5%, there is a problem that a crack and peeling off can easily be generated, and if the proportion exceeds 25%, a portion having no hard film 3 (first sliding surface m) is increased and there is a problem that the wear resistance is deteriorated.

It is preferable that at least a lower surface 24 of the piston ring base material 2 is subjected to a nitriding treatment, and in addition to this, an upper surface 22 and an inner peripheral surface 23 of the base material 2 may also be subjected to the nitriding treatment. According to this, it is possible to further enhance the wear resistance of the piston ring, a post-treatment becomes unnecessary and the producing step can be simplified.

The nitriding treatment is not especially limited. Examples of the nitriding treatment include a salt bath soft-nitriding treatment, a gas-nitriding treatment, a gas soft-nitriding treatment and an ion-nitriding treatment. It is preferable that a nitride layer having Vickers hardness (HV) of 700 or more is formed by the nitriding treatment as a nitride diffusion layer, a thickness of the nitride diffusion layer is 1 to 40 μm, and the thickness is more preferably 10 to 20 μm.

Next, the hard film 3 forming the first sliding surface will be described.

Material of the hard film 3 is not especially limited, and conventionally used various hard films can appropriately be selected and used only if an effect of the hard film 3 can be obtained, i.e., only if the film can enhance the wear resistance of the piston ring, in other words, only if the film is harder than the piston ring base material 2.

In the present invention, among the various hard films, it is preferable that the film is a Cr—N type or Cr—B—N type film formed by a PVD method (physical vapor deposition method).

Examples of the PVD method for forming the Cr—N type or Cr—B—N type hard film 3 include an ion plating method, a vacuum deposition method and a sputtering method.

It is preferable that the Cr—N type hard film 3 is formed of Cr, CrN and $Cr_2N$, and the Cr—N type hard film 3 includes 0.5 to 15.5% Cr by mass, 45.0 to 98.0% CrN by mass, and a balance of $Cr_2N$.

It is preferable that the Cr—B—N type hard film 3 includes 0.05 to 20% B by mass. The hard film formed by including B in a Cr—N alloy has excellent wear resistance and scuffing resistance, and especially excellent aggressiveness to mated material. If a contained amount of B is less than 0.05% by mass, expected effects of the scuffing resistance and aggressiveness to mated material cannot be obtained. If the contained amount of B exceeds 20% by mass, an internal stress of the hard film 3 becomes high, toughness is deteriorated, a crack and delamination are generated in the film, and a function as a piston ring can not be exerted. An especially preferable range of contained amount of B which configures the Cr—B—N type hard film 3 is 1 to 3% by mass, and a contained amount of N which configures the Cr—B—N type hard film 3 is in a range of 4.0 to 34.0% by mass and a balance is Cr.

Next, the second sliding surface n in the piston ring 1 of the present invention will be described.

As described above, the purpose of the second sliding surface n is to give the "gas sealing performance and oil scraping performance" to the piston ring 1. Therefore, it is preferable that an end n1 (other end, lower end in FIGS. 1A to 1C) of the second sliding surface n has a shape which is sharp to some extent.

Unlike the first sliding surface m, the second sliding surface n is not formed of hard film but is formed of the piston ring base material 2 itself as shown in FIGS. 1A to 1C. In other words, the piston ring base material is exposed. If the piston ring base material 2 itself is made as the second sliding surface n in this manner, even if the end n1 is formed into a sharp shape, a fracture such as a crack is not generated in that portion.

The second sliding surface n is characterized in that it exists at the position deviated inward from the phantom line S extending from the first sliding surface toward the other end direction (lower end in FIGS. 1A to 1C), but the deviation amount (f in FIG. 1C) is not especially limited. However, if the deviation amount f is excessively large, there is a fear that blow-by is generated from that portion. Therefore, it is preferable that the deviation amount f is about 1 to 20 μm and more preferably 1 to 10 μm, for example. If the deviation amount f exceeds 20 μm, a possibility that a lodging portion is generated when the piston ring is assembled into a ring groove of the piston and the sliding surface becomes chipped becomes high. If the deviation amount f is set to 10 μm or less, blow-by can be suppressed to a lower value, and it is possible to stably make it difficult to generate the lodging portion. If the deviation amount f is set to 1 μm or more, it is possible to prevent the second sliding surface n from being hitting strongly, and to prevent the second sliding surface n from locally wearing.

From the same viewpoint, it is necessary to take a proportion (5 to 25% of the entire length) of the second sliding surface n in the entire sliding surface (axial direction) into consideration, and it is preferable that the piston ring is designed such that the second sliding surface n becomes about 0.1 to 1.0 mm and more preferably about 0.2 to 0.5 mm, for example.

As described above, in the second sliding surface n, the piston ring base material 2 itself may be exposed, and the sliding surface may be subjected to the nitriding treatment.

Next, the producing method of the piston ring of the present invention will be described.

The producing method is not especially limited, and any producing method may be used only if the piston ring 1 has the above-described features as a final product.

FIGS. 2A to 2E are step diagrams showing one example of the producing method.

As show in FIG. 2A, the piston ring base material 2 provided with the recess 21 for forming the hard film 3 which will become the first sliding surface m is prepared. A depth H of the recess 21 is set deeper than the depth (h in FIG. 1C) of the recess 21 in the piston ring 1 as a final product. In other words, the depth H is deeper than a film thickness of the hard film 3 which will finally be formed on the recess 21. As a forming method of the recess 21, known techniques such as a cutting technique, a grinding technique, a polishing technique and a technique in which a shape of the recess 21 is previously formed on a wire rod may appropriately be selected and employed.

Next, the hard film 3 is formed on the entire outer peripheral surface of the base material 2 as show in FIG. 2B. The hard film 3 to be formed should have a thickness which is required for the piston ring 1 as the final product. The above-described various PVD methods may be used as the forming method of the hard film 3.

Next, as shown in FIG. 2C, a convex portion (shaded portion in FIG. 2C) formed on the side of a lower surface of the base material 2 is polished and removed along a surface of the hard film 3 formed on the recess 21 of the base material 2. At that time, the piston ring 2 which is softer than the hard film 3 is polished slightly more than the hard film 3 by polishing in parallel to the outer peripheral surface using hard grain (e.g., polishing agent such as $Al_2O_3$, SiC and diamond) as polishing agent.

As a result, the second sliding surface is completed at a deviated position as show in FIG. 2D, and the piston ring 1 of the present invention can be formed.

If the nitriding treatment is carried out in this state, a nitride diffusion layer 4 is formed on the piston ring base material 2 as shown in FIG. 2E.

According to the method shown in FIGS. 2A to 2E, after the hard film 3 is formed on the entire outer peripheral surface of the base material 2, the unnecessary portion is removed. According to this, the base material 2 can finally be exposed from a predetermined portion (edge portion on the side of the lower surface). Hence, even when the hard film 3 is formed by the PVD method, it is unnecessary to use a mask and it is possible to relatively easily and inexpensively produce the piston ring of the present invention.

Figure 3A:
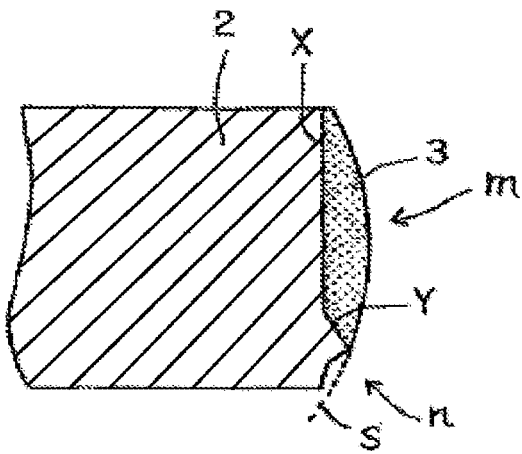
FIGS. 3A and 3B are sectional views showing another example of the piston ring of the present invention.
Figure 3B:
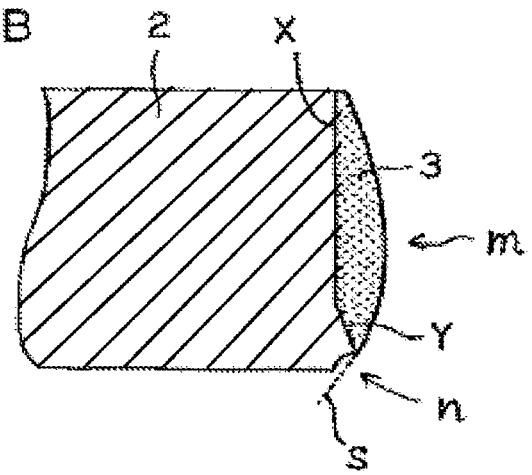

FIGS. 3A and 3B are sectional views showing another example of the piston ring of the present invention.

In the piston ring of the present invention, the sliding surface 10 thereof can be formed into a barrel face shape as shown in FIG. 3A, or the sliding surface 10 can be formed into an eccentric barrel face shape as shown in FIG. 3B. If the sliding surface 10 is formed into the barrel face shape, it is possible to prevent gas from leaking from the outer peripheral surface (sliding surface) while carrying out oil film lubrication.

In this case also, if the second sliding surface is deviated inward from the phantom line S extending from the original barrel face shaped first sliding portion m, the piston ring of the present invention can be obtained.

When the outer peripheral surface of the piston ring has the barrel face shape or the eccentric barrel face shape, the outer peripheral surface Z has a curved surface shape, but it is possible to find a shown in FIG. 1 using a tangent which is portrayed on a boundary point between the first sliding surface m and the second sliding surface n.

The piston ring of the present invention can be used not only for a top ring which functions as a so-called pressure ring, but also for a second ring which is the same pressure ring, and the present invention can also be applied to an oil ring.

FIGS. 1A to 1C and 2A to 2E show an example of the so-called pressure ring. In this case, it is preferable that the hard film 3 is formed on the side of the upper surface of the piston ring and the side of the upper surface is used as the first sliding surface, and the side of the lower surface is used as the second sliding surface n, as shown in FIGS. 1A to 1C and 2A to 2E. This is because that in the pressure ring, it is possible to prevent a crack and peel off by exposing the base material 2 without forming the hard film 3 on the edge portion on the side of the lower surface.

Figure 4A:
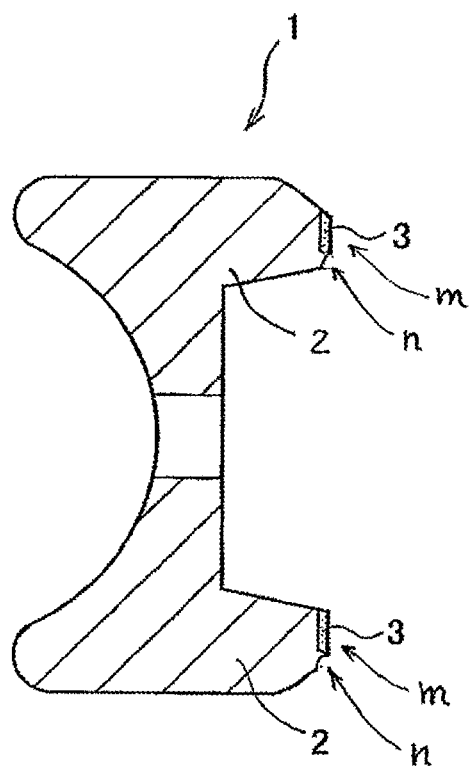
FIGS. 4A and 4B are sectional views when the piston ring of the present invention is applied to an oil ring.
Figure 4B:
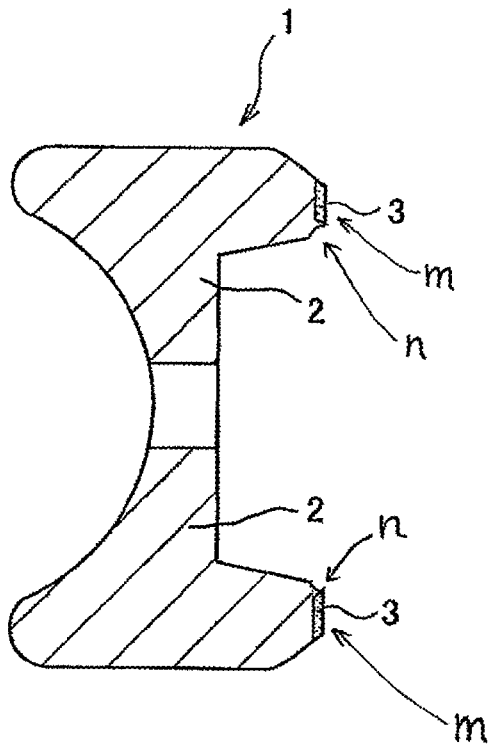

FIGS. 4A and 4B are sectional views when the piston ring of the present invention is applied to the oil ring.

In a two-piece oil ring including a coil expander (not shown) and an oil ring body 1, as shown in FIG. 4A, the hard film 3 can be formed on upper and lower two sliding surfaces and on the side of the upper surface and they can be used as the first sliding surfaces m, and the side of the lower surface can be used as the second sliding surfaces n. In this case, an oil scraping direction is a downward direction of the oil ring body 1.

As shown in FIG. 4B, in the case of the upper sliding surface, the hard film 3 may be formed on the side of the upper surface and this may be made as the first sliding surface m, and the side of the lower surface may be made as the second sliding surface n, and in the case of the lower sliding surface, the hard film 3 may be formed on the side of the lower surface and this may be made as the first sliding surface m, and the side of the upper surface may be made as the second sliding surface n. In this case, an oil scraping direction is a central portion of the oil ring body 1.

EXAMPLES

The piston ring of the present invention will be described in more concretely using Examples.

Examples 1 to 12

The piston ring (oil ring) shown in FIG. 1 was produced using the method explained using FIGS. 2A to 2E.

Here, SUS440B expressed in JIS was used as the base material (2).

The hard films (3) were Cr—B—N (Examples 1 to 6) and Cr—N (Examples 7 to 12) formed by the ion plating method.

Sizes of the produced piston ring were as follows: a diameter was 115 mm, a width (h1) in the axial direction was 3.0 mm, and a width (a1) in the radial direction was 3.95 mm. A length (n) of the base material exposed from a lower portion (edge portion) of an outer peripheral sliding surface of the piston ring was 0.2 to 0.5 mm.

In the Examples 1 to 12, a value of an angle (a) formed between the piston ring outer peripheral surface (Z) and the second surface (Y) which configures the recess (21) formed in the base material (2) is as shown in Table 1. The piston ring was cut so that a cross section thereof in its axial direction could be observed, the cross section was polished and mirror-polished, the cross section was magnified a hundred times and the angle (a) formed between the second surface (Y) and the piston ring outer peripheral surface (Z) was checked. In these Examples, as shown in the following Table 1, some portions of the base materials where the hard films (3) were formed were subjected to the nitriding treatment, and other portions of the base materials where the hard films (3) were formed were not subjected to the nitriding treatment.

Concerning the nitriding treatment, nitride diffusion layers having thicknesses of 10 to 20 μm were formed using the gas nitriding method.

Comparative Examples 1 to 4

Piston rings of comparative examples were produced in the same manner as those of the Examples. In the piston rings of the comparative examples, a value of the angle (a) formed between the piston ring outer peripheral surface (Z) and the second surface (Y) which configured the recess (21) formed in the base material (2) was set to 30°, and the deviation amount f of the second sliding surface was set to 0 (zero). Details thereof are as shown in Table 1.

Conventional Examples 1 to 2

Conventional examples in which hard films (3) were formed on the entire outer peripheral surfaces of the base materials (2) were produced in the same manner as those of the Examples. Details thereof are as shown in Table 1.

<Peel Test>

Figure 5:
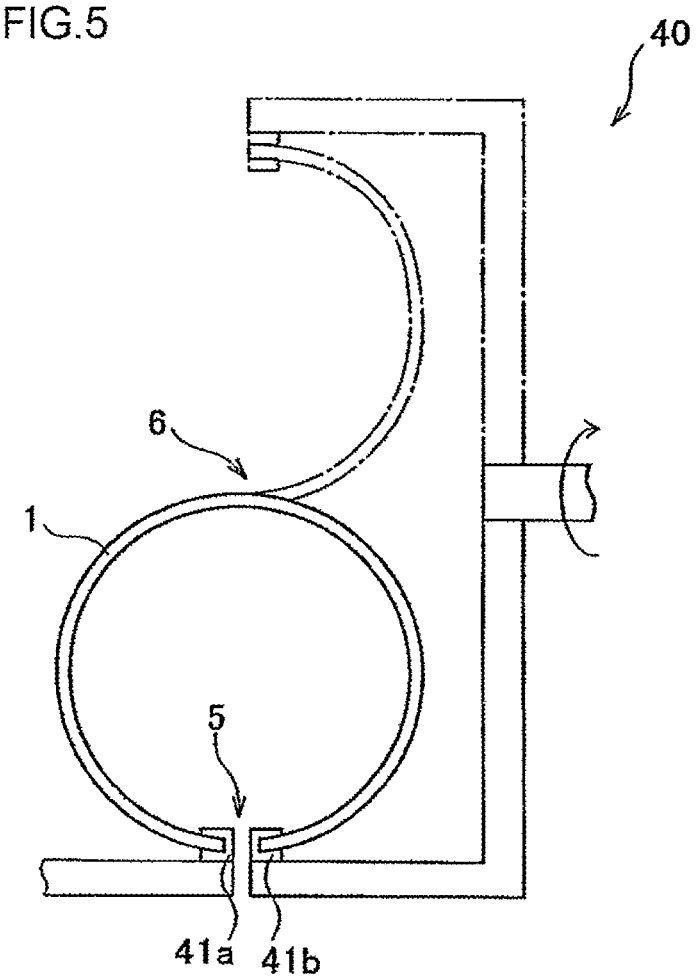
FIG. 5 is an explanatory diagram of a peel test (twist test)

A twist test was carried out using a twist peel test machine 40 shown in FIG. 5.

In the twist test, opposed mating ends of a gap 5 of the piston ring 1 are held by holding tools 41a and 41b, the holding tool 41a is fixed, the holding tool 41b is rotated around an opposite side 6 of the gap in a radial direction of the piston ring 1 as shown with dashed lines, and the piston ring 1 is twisted at a predetermined twisting angle. The twisting angle was 90°. After the piston ring 1 was twisted, the opposite side 6 which was opposite from the gap of the piston ring 1 was cut, and it was visually observed whether a film layer in the cut surface (fracture) was peeled off from a ring base material. As a result of the observation, a case where a crack or peel was not found at all was shown with ◯, and a case where a crack or peel was found even slightly was shown with x. The peel test was carried out for the Examples 1, 4, 5, 7, 10, 11, the comparative examples 1 to 4 and the conventional example 1.

A result thereof is shown in the following Table 1.

TABLE 1

| | α | n (mm) | f (μm) | Film | Surface treatment of base material | Result of peel test |
|---|---|---|---|---|---|---|
| Example 1 | 10 | 0.3 | 6 | Cr—B—N | None | ◯ |
| Example 2 | 10 | 0.4 | 3 | Cr—B—N | Nitride layer | — |
| Example 3 | 15 | 0.4 | 4 | Cr—B—N | Nitride layer | — |
| Example 4 | 20 | 0.3 | 5 | Cr—B—N | None | ◯ |
| Example 5 | 30 | 0.5 | 10 | Cr—B—N | None | ◯ |
| Example 6 | 30 | 0.5 | 2 | Cr—B—N | Nitride layer | — |
| Example 7 | 10 | 0.2 | 5 | Cr—N | None | ◯ |
| Example 8 | 10 | 0.3 | 4 | Cr—N | Nitride layer | — |
| Example 9 | 15 | 0.3 | 3 | Cr—N | Nitride layer | — |
| Example 10 | 20 | 0.3 | 5 | Cr—N | None | ◯ |
| Example 11 | 30 | 0.4 | 7 | Cr—N | None | ◯ |
| Example 12 | 30 | 0.3 | 3 | Cr—N | Nitride layer | — |
| Comparative Example 1 | 30 | 0.5 | 0 | Cr—B—N | None | ◯ |
| Comparative Example 2 | 30 | 0.8 | 0 | Cr—B—N | None | ◯ |
| Comparative Example 3 | 30 | 0.5 | 0 | Cr—B—N | Nitride layer | ◯ |
| Comparative Example 4 | 30 | 0.8 | 0 | Cr—B—N | Nitride layer | ◯ |
| Conventional Example 1 | — | — | — | Cr—B—N | None | ◯ |
| Conventional Example 2 | — | — | — | Cr—B—N | Nitride layer | — |

<Real Machine Test>

An oil consumption amount and a blow-by gas amount were measured using an inline six-cylinder diesel engine having a piston displacement of 8,000 cc and a bore diameter of ϕ115 mm. A wear amount of a lower surface of a first pressure ring was measured by profiles before and after a real machine was operated.

A combination of piston rings at that time is as follows: a first pressure ring includes 0.9% C (by mass), 0.4% Si, 0.3% Mn, 17.5% Cr, 1.1% Mo, 0.1% V, 0.01% P, and 0.01% S (corresponding to SUS440B material expressed in JIS), a width (h1) of the ring in its axial direction is 3.0 mm, a width (a) of the ring in its radial direction is 3.95 mm, specifications of the Examples 3 and 4 and the conventional example 1 are used, a second pressure ring includes material corresponding to 10Cr steel material, a width (h1) of the ring in its axial direction is 2.5 mm, and a width (a1) of the ring in its radial direction is 4.3 mm. The oil ring corresponds to SUS410J1 material expressed in JIS, a width (h1) of the ring in its axial direction is 4.0 mm, a width (a1) of a single oil ring in its radial direction is 2.35 mm, and a width (a1) is 4.35 mm when the oil ring is combined with a coil expander.

In the real machine test, specifications of the second pressure ring and the oil ring were constant, and only the first pressure ring was changed. An outer peripheral sliding surface of the first pressure ring was formed into a barrel face shape, and an outer peripheral sliding surface of the second pressure ring was formed into a tapered shape.

The concrete test method was as follows: the engine revolution number was 2,200 rpm under a condition of WOT (Wide Open Throttle), numeric values of a blow-by gas amount using a pressure ring of the conventional example 1 and an oil consumption amount were defined as 1, and a result of a test was obtained using compression rings of the conventional example 2 and the Examples 2, 3, 5 and 6. Concerning the wear amount, a numeric value of a wear amount of a ring lower surface using a pressure ring of the conventional example 1 was defined as 1, and results of tests using the compression rings of the Examples 3, 5 and 6 were obtained as indices. Results thereof are shown in FIG. 6

Figure 6:
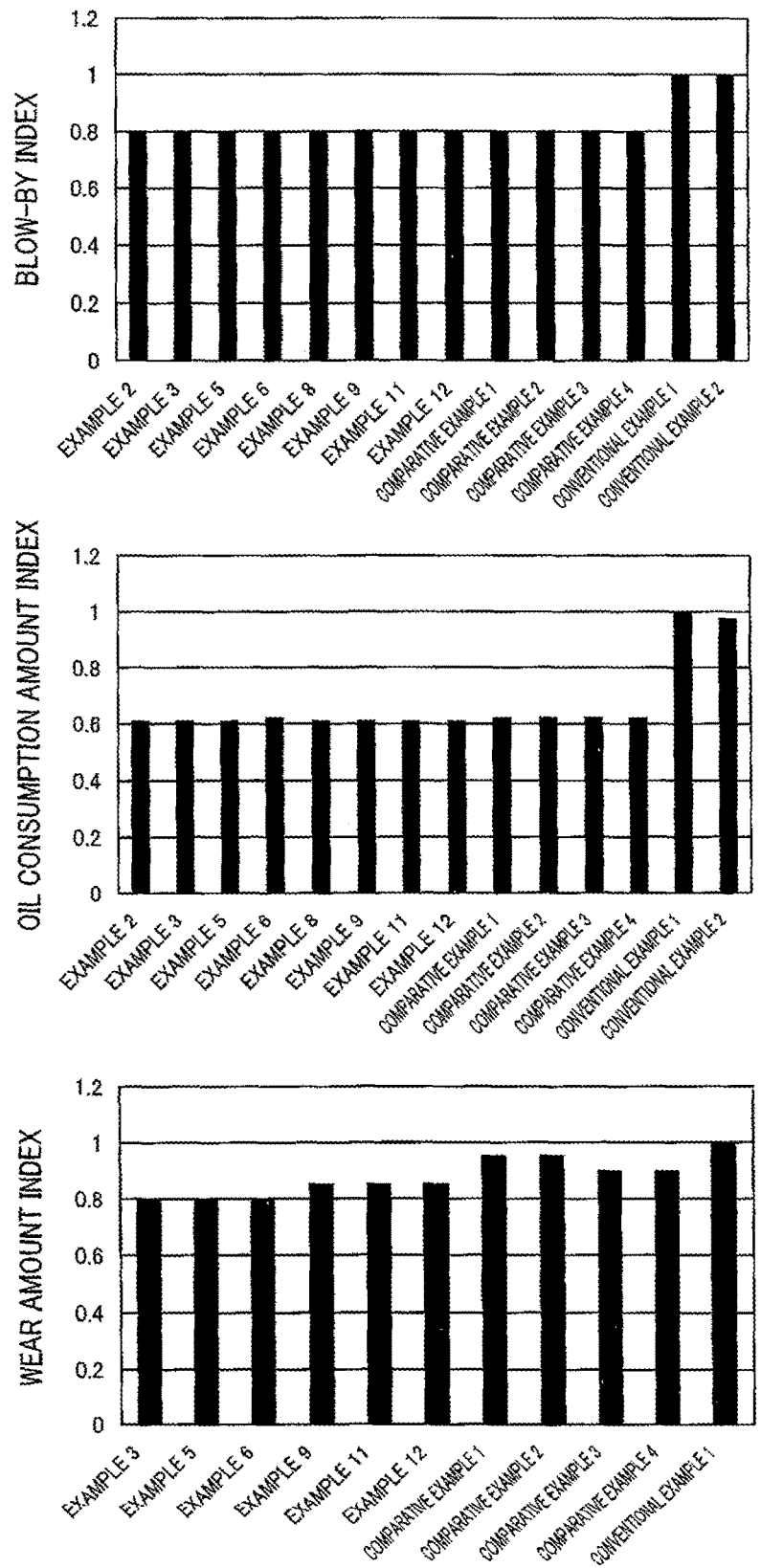
FIG. 6 is a diagram showing a blow-by gas amount, an oil consumption amount and a wear amount.

As can be found from Table 1 and FIG. 6, according to the piston ring of the present invention, it is possible to enhance peel resistance, wear resistance, gas sealing performance and oil scraping performance as compared with those of the conventional technique.

DESCRIPTION OF REFERENCE NUMERALS

1 . . . piston ring
2 . . . base material
3 . . . hard film
4 . . . nitride diffusion layer
5 . . . gap
10 . . . sliding surface
21 . . . recess
m . . . first sliding surface
n . . . second sliding surface
S . . . phantom line

The invention claimed is:

1. A method for producing a piston ring cylinder that moves in a sliding direction, comprising:
   providing a piston ring base material having an upper surface, a lower surface and an outer circumferential surface between the upper surface and the lower surface,
   forming a first recess by removing a first part of the piston ring base material in a part of the outer circumferential surface, a remaining part of the outer circumferential surface being a cylindrical surface formed directly below the first recess in the sliding direction, the first recess having a bottom surface parallel to the outer circumferential surface and in inclined surface extending from the bottom surface to the cylindrical surface;
   forming a hard film on the bottom surface and the inclined surface of the first recess and on the cylindrical surface at a predetermined thickness, the hard film having a higher hardness than the piston ring base material, an outer surface of the hard film on the bottom surface of the first recess establishing a sliding surface;
   forming a second recess by performing a polishing process on the sliding surface including:
   removing the hard film formed on the cylindrical surface;
   removing the hard film formed on a part of the inclined surface of the first recess and a second part of the piston ring base material disposed adjacent to the cylindrical surface, to a point substantially flush with the sliding surface, and
   removing a third part of the piston ring base material from a section of the piston ring base material exposed by removal of the second part of the piston ring base material by the second step,
   wherein the second recess is directly connecting the first recess and forming a connecting vertex with the inclined surface of the first recess.

2. The method according to claim 1, further comprising:
   forming a nitride diffusion layer on the piston ring base material after forming the second recess.

3. The method according to claim 2, wherein the nitride diffusion layer is directly formed on the upper surface and the lower surface of the piston ring base material and on the second recess.

4. The method according to claim 1, wherein the first recess is formed on the piston ring base material by at least one of cutting, grinding and polishing the piston ring base material.

5. The method according to claim 1, wherein
   the inclined surface forms an angle 10°-30° with the sliding surface.

6. The method according to claim 1, wherein the first recess has a higher depth from the sliding surface than the second recess.

7. The method according to claim 1, wherein the first recess has a depth of 10 μm to 60 μm.

8. The method according to claim 1, wherein the second recess has a depth of 1 μm to 20 μm.

9. The method according to claim 1, wherein a length of the second recess in the sliding direction is about 5%-25% of a distance between the upper surface and the lower surface of the piston ring base material in the sliding direction.

10. The method according to claim 1, wherein the hard film is formed by a PVD method.

11. The method according to claim 1, wherein the hard film comprises a Cr—N type film or a Cr—B—N type film.

12. The method according to claim 1, wherein the second recess has a curved surface extending from the connecting vertex.

13. The method according to claim 12, wherein the second recess further has a flat surface extending from the lower surface of the piston ring base material and the curved surface.

14. The method according to claim 1, wherein the predetermined thickness for the hard film formed in the first recess and on the cylindrical surface is substantially the same as a depth of the first recess after removing the hard film on the part of the inclined surface of the first recess and the second part of the piston ring base material disposed adjacent to the cylindrical surface at the second step.

15. The method according to claim 1, wherein the sliding surface is polished such that the sliding surface is parallel with the sliding direction.

16. The method according to claim 1, wherein the sliding surface is polished such that the sliding surface is curved relative to the sliding direction.

17. The method according to claim 16, wherein the sliding surface has a barrel face shape.

18. The method according to claim 16, wherein the sliding surface has an eccentric barrel face shape.

* * * * *